United States Patent
Shi et al.

(10) Patent No.: US 10,770,364 B2
(45) Date of Patent: Sep. 8, 2020

(54) CHIP SCALE PACKAGE (CSP) INCLUDING SHIM DIE

(71) Applicant: Xilinx, Inc., San Jose, CA (US)

(72) Inventors: Hong Shi, Fremont, CA (US); Suresh Ramalingam, Fremont, CA (US); Siow Chek Tan, Los Gatos, CA (US); Gamal Refai-Ahmed, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/951,941

(22) Filed: Apr. 12, 2018

(65) Prior Publication Data

US 2019/0318975 A1 Oct. 17, 2019

(51) Int. Cl.
| | | |
|---|---|---|
| H01L 23/31 | (2006.01) | |
| H01L 23/367 | (2006.01) | |
| H01L 23/00 | (2006.01) | |
| H01L 25/065 | (2006.01) | |

(52) U.S. Cl.
CPC ...... *H01L 23/3114* (2013.01); *H01L 23/3128* (2013.01); *H01L 23/367* (2013.01); *H01L 24/14* (2013.01); *H01L 24/17* (2013.01); *H01L 25/0652* (2013.01); *H01L 2225/06548* (2013.01); *H01L 2225/06555* (2013.01); *H01L 2225/06586* (2013.01)

(58) Field of Classification Search
CPC ............ H01L 23/3114; H01L 23/3128; H01L 23/367; H01L 24/14; H01L 24/17; H01L 25/0652; H01L 2225/06555; H01L 2225/06586; H01L 2225/06548
USPC ..................................... 257/713, 698
See application file for complete search history.

(56) References Cited

U.S. PATENT DOCUMENTS

| | | | |
|---|---|---|---|
| 9,768,133 B1 | 9/2017 | Wu et al. | |
| 2005/0121770 A1* | 6/2005 | Baek ............... | H01L 23/5227 257/698 |
| 2014/0203429 A1* | 7/2014 | Yu ................... | H01L 21/78 257/737 |
| 2016/0111398 A1* | 4/2016 | Hsiao ............... | H01L 24/24 257/534 |
| 2016/0322330 A1 | 11/2016 | Lin et al. | |
| 2018/0033771 A1* | 2/2018 | Yu ................... | H04N 1/3876 |
| 2018/0047683 A1 | 2/2018 | Lee et al. | |

* cited by examiner

*Primary Examiner* — Bo Fan
(74) *Attorney, Agent, or Firm* — Patterson + Sheridan, LLP

(57) ABSTRACT

Examples of the present disclosure provide example Chip Scale Packages (CSPs). In some examples, a structure includes a first integrated circuit die, a shim die that does not include active circuitry thereon, an encapsulant at least laterally encapsulating the first integrated circuit die and the shim die, and a redistribution structure on the first integrated circuit die, the shim die, and the encapsulant. The redistribution structure includes one or more metal layers electrically connected to the first integrated circuit die.

20 Claims, 7 Drawing Sheets

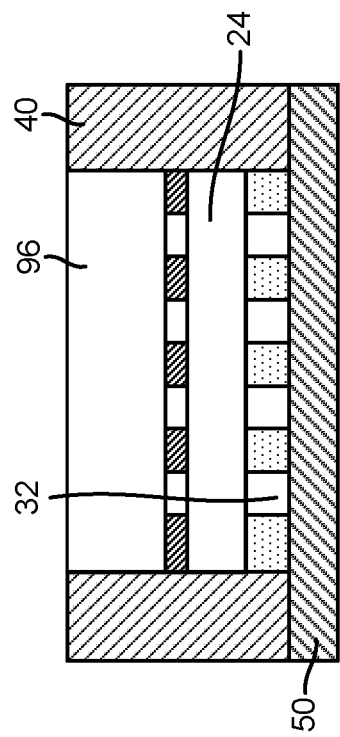
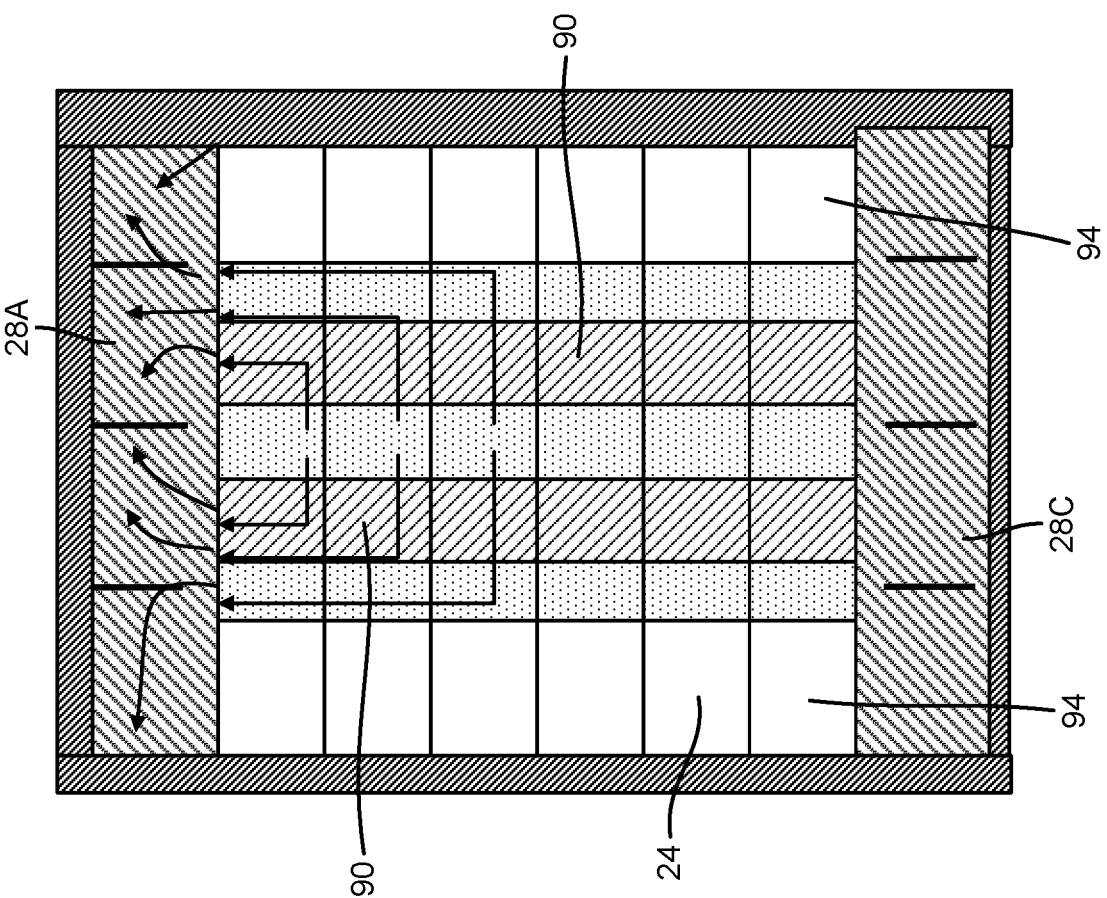

CHIP SCALE PACKAGE (CSP) INCLUDING SHIM DIE

TECHNICAL FIELD

Examples of the present disclosure generally relate to a Chip Scale Package (CSP) and, in particular, to a CSP that includes one or more shim dies.

BACKGROUND

Generally, integrated circuits are encapsulated in packages that can, among other things, protect the integrated circuits from potential atmospheric damage and from forces that might damage the integrated circuit. Evolution of the size and density of integrated circuits on a die have likewise corresponded with evolution of packaging techniques. A packaging technique that has been developed is the Chip Scale Package (CSP), which can generally package one or more dies within some physical scale of the size(s) of the die(s). The decrease of size of the integrated circuits and corresponding dies therefore has generally resulted in a decrease in the size of a CSP. This decrease of size can have benefits. Some benefits of a CSP with decreased size can be higher density, smaller footprint, shorter electrical routing, and reduced power consumption.

SUMMARY

Examples of the present disclosure generally relate to a Chip Scale Package (CSP). Various CSPs described herein can facilitate route escape or fanout of bumps on the CSP (which can reduce a number of layers of metal patterns in the CSP and/or a package substrate to which the CSP is attached), can improve thermal dissipation, and/or can improve noise de-coupling on an integrated circuit die in the CSP.

An example of the present disclosure is a structure. The structure includes a first integrated circuit die, a shim die, an encapsulant at least laterally encapsulating the first integrated circuit die and the shim die, and a redistribution structure on the first integrated circuit die, the shim die, and the encapsulant. The redistribution structure includes one or more metal layers electrically connected to the first integrated circuit die.

Another example of the present disclosure is a method of operating an integrated circuit. One or more input signals are transmitted to a package via one or more first conductive bumps attached between the package and a package substrate. One or more output signals are received from the package via one or more second conductive bumps attached between the package and the package substrate. The package includes an integrated circuit die, a shim die, an encapsulant at least laterally encapsulating the integrated circuit die and the shim die, and a redistribution structure on the integrated circuit die, the shim die, and the encapsulant. The redistribution structure includes one or more metal layers electrically connected to the integrated circuit die. The first conductive bumps and the second conductive bumps are attached to the redistribution structure.

Yet another example of the present disclosure is a structure. The structure includes a CSP. The CSP includes an integrated circuit die, a shim die, an encapsulant at least laterally encapsulating the integrated circuit die and the shim die, and a redistribution structure on the integrated circuit die, the shim die, and the encapsulant. The redistribution structure includes one or more metal layers electrically connected to the integrated circuit die. The structure further includes conductive bumps attached to the redistribution structure of the CSP, and includes a package substrate. The conductive bumps are electrically connected to the one or more metal layers. The conductive bumps are attached to the package substrate.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

FIG. 5A is an example layout of an integrated circuit die and shim dies in a CSP, in accordance with examples of the present disclosure.

FIG. 5B is an example cross-sectional view of the integrated circuit die of FIG. 5A stacked with another integrated circuit die, in accordance with examples of the present disclosure.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
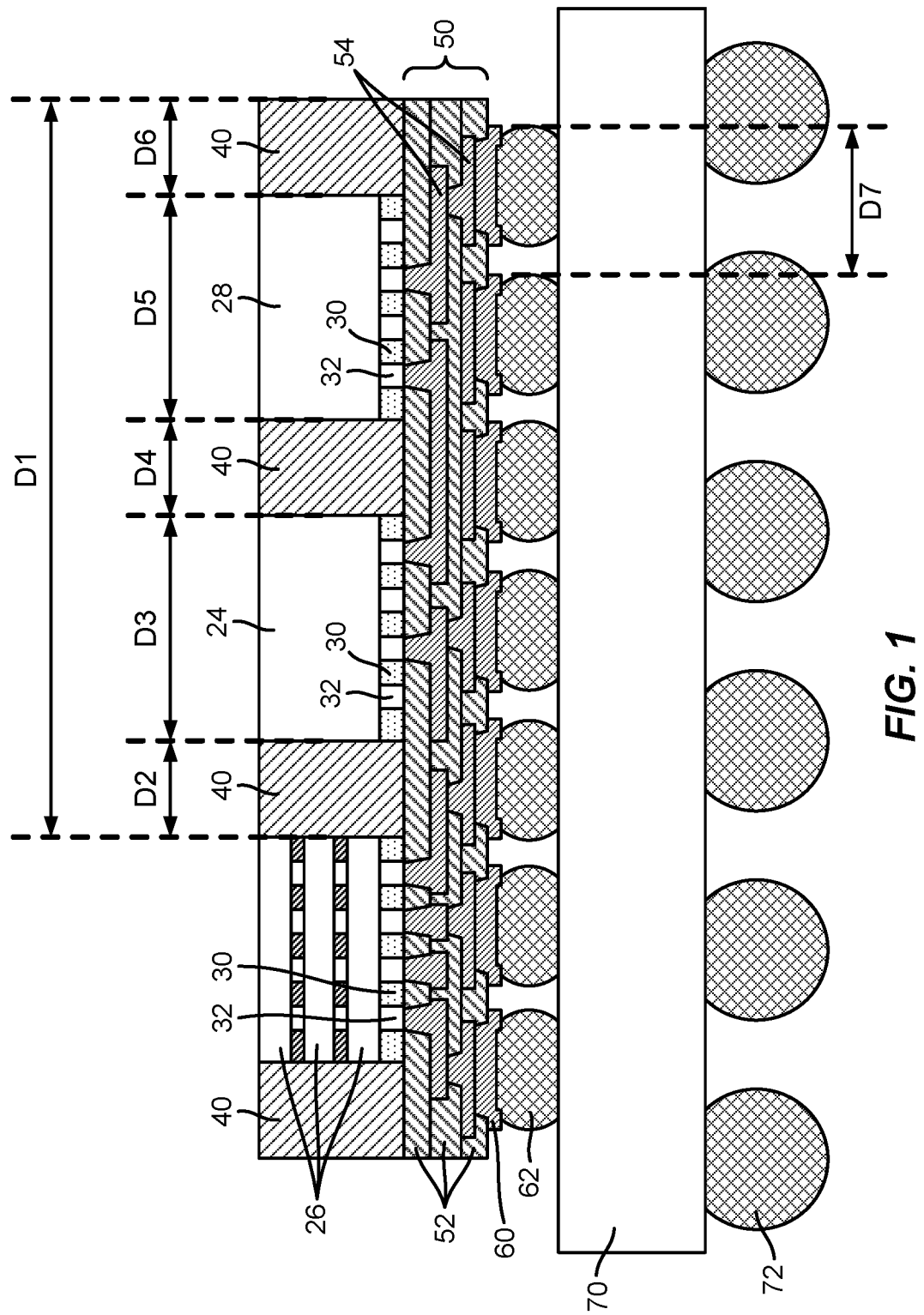
FIG. 1 is a cross-sectional view of an example Chip Scale Package (CSP) attached to a package substrate, in accordance with examples of the present disclosure.

Examples of the present disclosure provide example Chip Scale Packages (CSPs). An example CSP includes one or more shim dies. Each shim die can be a dummy die without any active or passive circuitry thereon or can include an integrated passive device (IPD) without any active circuitry thereon.

Generally, by including one or more shim dies in a CSP, a layout area of the CSP can be increased compared to a CSP that does not include a shim die. The increased area can expand a redistribution layer (RDL) for placement of bumps and for input/output (IO) escape routing. Hence, high density IO pillars on an integrated circuit die can be transformed to more sparse and less dense bumps on the CSP. This transformation can be accomplished by both the IO pattern and the IO location. Also, the increased area and corresponding decrease in density in escape routing and bumps can permit fewer metal pattern layers in the RDL and fewer layers in a package substrate (to which the CSP is to be attached) to be implemented. The shim die(s) can scale in size to accommodate various IO counts, IO patterns, routing spacing, and bump pitch.

Further, the increased area can permit a larger heat sink to be used and with increased contact to the CSP for improved heat dissipation laterally from local hot spots on an integrated circuit die in the CSP. A larger heat sink can have increased surface area for more efficient heat dissipation.

Additionally, for an example CSP that includes a shim die with a de-coupling capacitor, the de-coupling capacitor can be connected to the integrated circuit die through the RDL. The de-coupling capacitor may be physically closer to the integrated circuit die, which can reduce parasitic inductance that may arise due to long lines or traces that might otherwise connect a de-coupling capacitor to the integrated circuit die.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described.

FIG. 1 illustrates a cross-sectional view of an example CSP attached to a package substrate, in accordance with examples of the present disclosure. Other configurations of CSPs may be implemented in other examples.

The CSP of FIG. 1 includes an integrated circuit die 24, a memory die stack 26, and a shim die 28. The integrated circuit die 24 can be or include a processor, an application specific integrated circuit (ASIC), a programmable integrated circuit (e.g., field-programmable gate array (FPGA) or complex programmable logic device (CPLD)), or the like. In some examples, the integrated circuit die 24 is a System-on-Chip (SoC). For example, the SoC can include a plurality of processor cores in a processor system, programmable logic, and a Network-on-Chip (NoC) interconnecting the processor system and programmable logic. The memory die stack 26 can include multiple memory dies, which may implement any form of memory such as static random access memory (SRAM), dynamic random access memory (DRAM), synchronous DRAM (SDRAM), erasable programmable read-only memory (EPROM), electrically erasable programmable read-only memory (EEPROM), flash memory, the like, or a combination thereof. The memory die stack 26 can implement a standard or proprietary access format, such as double data rate fourth generation SDRAM (DDR4 SDRAM). The memory dies may be attached in a three-dimensional stack, for example, using electrical connectors to physically and electrically connect neighboring dies and using an underfill between neighboring dies. The memory dies may be stacked according to any technology.

The shim die 28 can be a dummy die or can include an integrated passive device (IPD). In some examples, the shim die 28 can be a dummy die without any active or passive circuitry thereon. In some examples, the shim die 28 can include an IPD, such as a capacitor, inductor, or resistor, without any active circuitry thereon.

The layout of the integrated circuit die 24, memory die stack 26, and shim die 28 in the CSP can take any configuration. Further, any number of dies (for example, any number of shim dies) may be included in the CSP. Dies can be stacked like the memory die stack 26, unstacked, or any combination thereof in the CSP.

Each of the integrated circuit die 24 and the top die of the memory die stack 26 have conductive pillars 32 formed on the active side of the respective die, which are further at least laterally encapsulated with a dielectric material 30. The conductive pillars 32 are on the active side of the die to form electrical connections between a redistribution layer (RDL) 50 (described below) and the circuits on the die. As illustrated, the shim die 28 has conductive pillars 32 with a dielectric material 30; however, in some examples, no conductive pillar 32 is on the shim die 28. Conductive pillars 32 may be present on the shim die 28 when the shim die 28 includes an IPD, where the conductive pillars 32 are for forming an electrical connection to the IPD. Additionally, conductive pillars 32 may be present on the shim die 28 where the conductive pillars 32 may facilitate a better physical connection to the subsequently formed RDL, such as to prevent delamination of the RDL from the shim die 28.

An encapsulant 40 laterally encapsulates the dies 24, 26, 28. The encapsulant 40 may be a molding compound, epoxy, or the like. An RDL 50 with under bump metallizations (UBMs) 60 is on the dies 24, 26, 28 and encapsulant 40. The RDL 50 includes one or more dielectric layers 52 with metal patterns 54. The dielectric layer 52 can be, for example, polybenzoxazole (PBC)), polyimide, benzocyclobutene (BCB), or the like. Each metal pattern 54 is formed on and/or through a respective dielectric layer 52 to an underlying metal pattern 54 or conductive pillar 32. The metal patterns 54 may be or include, for example, copper, titanium, tungsten, aluminum, or the like. The metal patterns 54 in the RDL 50 can interconnect various ones of the dies 24, 26, 28 and can be used to escape or route connections from the dies 24, 26, 28 to UBMs 60 and bumps 62. The RDL 50 can include any number of dielectric layers 52 and metal patterns 54. The UBMs 60 are formed on and through the outer dielectric layer 52 to an underlying metal pattern 54. In some examples, the UBMs 60 can be or include various configurations of metal layers, such as a configuration of chrome/chrome-copper alloy/copper/gold, a configuration of titanium/titanium tungsten/copper, a configuration of copper/nickel/gold, or the like.

Bumps 62 are attached to the UBMs 60. The bumps 62 can be, for example, controlled collapse chip connection (C4) bumps, which may include a conductive material such as solder (e.g., lead-free solder), copper, aluminum, gold, nickel, silver, palladium, tin, the like, or a combination thereof.

The CSP is attached to a package substrate 70 using the bumps 62. The package substrate 70 can be a printed circuit board (PCB), for example. The package substrate 70 can include an insulating core such as a fiberglass reinforced resin core (e.g., FR4, bismaleimide-triazine (BT) resin, or the like). Build up films such as Ajinomoto build-up film (ABF) or other laminates may be used for any number of dielectric layers for forming metal traces or lines thereon and/or therein. The bumps 62 can be attached to bond pads on the package substrate 70. The package substrate 70 may also have balls 72 formed on the side of the package substrate 70 opposite from the side on which the CSP is attached. The balls 72 may be ball grid array (BGA) balls or the like, which may include solder (e.g., lead-free solder) or the like.

FIG. 1 further illustrates dimensions of the CSP. In some embodiments, any bumps 62 directly underlying the memory die stack 26 are not input/output (IO) bumps. IO bumps of the bumps 62 are, in those embodiments, disposed in regions underlying the integrated circuit die 24, shim die 28, and encapsulant 40 extending from those dies 24, 28, which is illustrated along dimension D1 in FIG. 1. The dimension D1 is the sum of a dimension D2 (along the encapsulant 40 extending from the integrated circuit die 24 (e.g., between the integrated circuit die 24 and memory die stack 26)), a dimension D3 (a dimension of the integrated circuit die 24), a dimension D4 (along the encapsulant 40 between the integrated circuit die 24 and shim die 28), a dimension D5 (a dimension of the shim die 28), and dimension D6 (along the encapsulant 40 extending from the shim die 28). In some examples, the dimensions D2 and D6 may be 0.4 mm, and the dimension D4 may be 70 µm. The dimension D1 may determine a linear pitch D7 of IO bumps of the bumps 62. The linear pitch D7 may be the dimension D1 minus the width of one bump 62, which is then divided by a number of IO bumps linearly aligned in a direction corresponding with the dimension D1. Conversely, a maximum number of IO bumps linearly aligned in a direction corresponding with the dimension D1 may be equal to the dimension D1 divided by the linear pitch D7. A desired target linear pitch D7 may therefore be achieved by tuning, for example, the dimension D5 of the shim die 28, as illustrated further below. Conversely, a desired number of IO bumps having a given linear pitch D7 may therefore be achieved by tuning, for example, the dimension D5 of the shim die 28.

Figure 2:
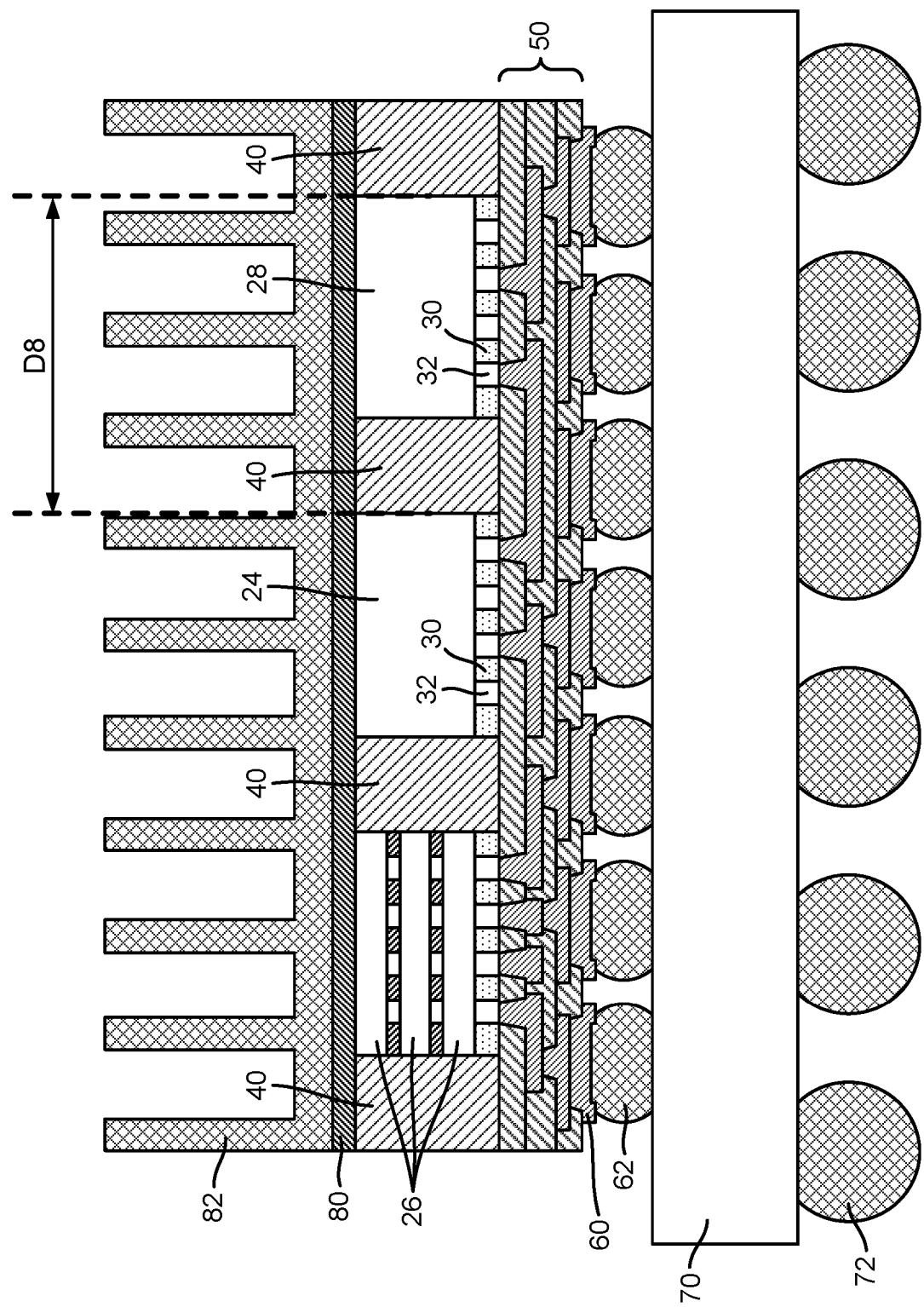
FIG. 2 is a cross-sectional view of an example CSP attached to a package substrate, where a heat sink is attached to the CSP, in accordance with examples of the present disclosure.

FIG. 2 illustrates a heat sink 82 attached to the CSP. The heat sink 82 is attached to a back side of the CSP by a thermal interface material (TIM) 80. The heat sink 82 includes a base (which is adhered by the TIM 80) and fins projecting from the base. The fins create a larger surface area for dissipating heat from the heat sink 82 compared to a heat sink without fins. In some examples, different configurations of heat sinks may be implemented, such as a cap or base without fins. The heat sink 82 may be or include a material with a high thermal conductivity, such as copper or the like.

In the cross-sectional view of FIG. 2, the length of the heat sink 82 can be larger by an amount D8 compared to if the CSP did not include the shim die 28. The amount D8 includes a spacing between the integrated circuit die 24 and the shim die 28 and includes a width of the shim die 28. Other layouts of CSPs (which may include any number of shim dies 28) can result in the amount D8 to include spacings, lengths, and/or widths of other components. The amount D8 permits the heat sink 82 to be larger. A larger heat sink 82 may dissipate heat more efficiently from one or more heat sources, such as the integrated circuit die 24. For example, heat density may be high at the integrated circuit die 24, and the shim die 28 can be placed proximate the integrated circuit die 24 to permit a larger heat sink 82 without creating an additional high density heat source.

Figure 3:
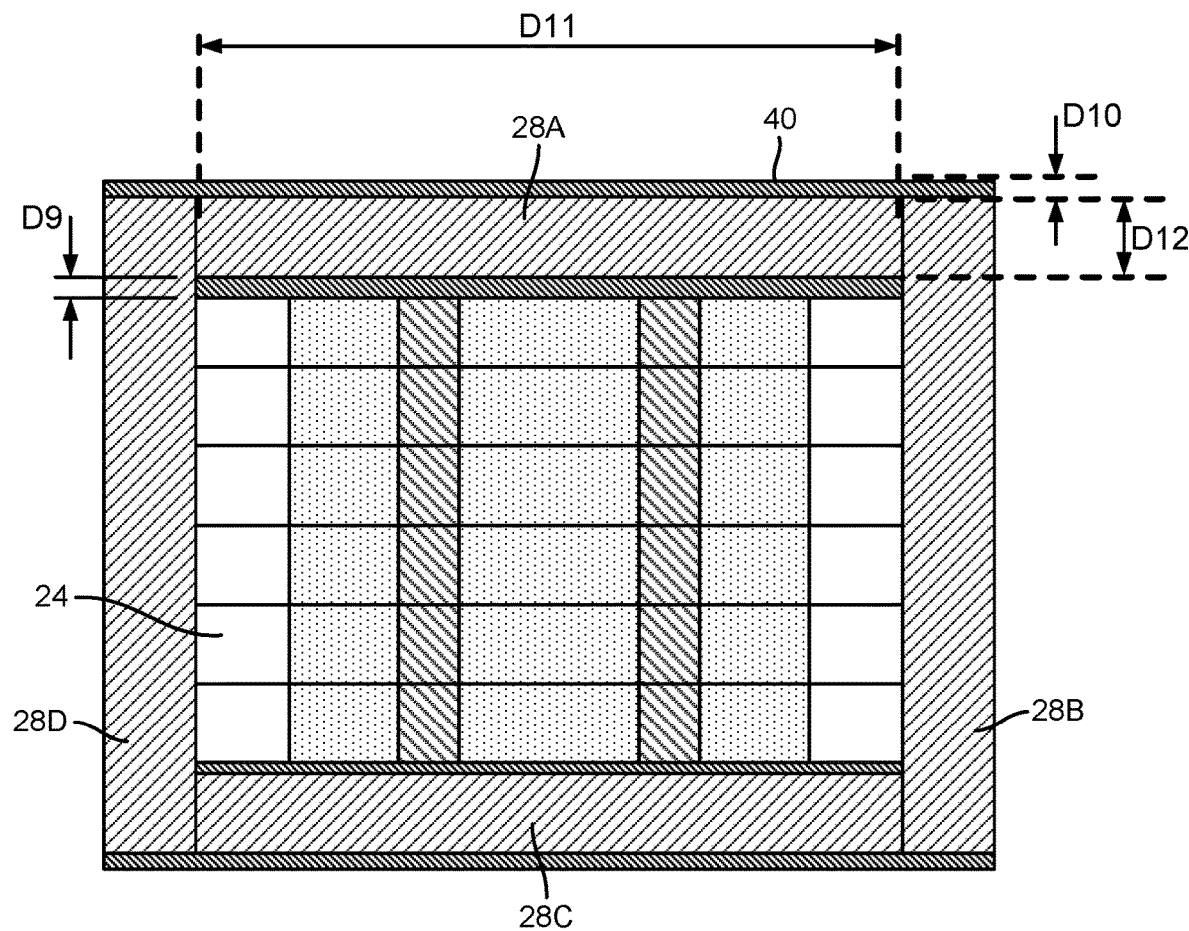
FIG. 3 is an example layout of an integrated circuit die and shim dies in a CSP, in accordance with examples of the present disclosure.

FIG. 3 illustrates an example layout of an integrated circuit die 24 and shim dies 28A, 28B, 28C, 28D in a CSP, in accordance with examples of the present disclosure. The shim dies 28A, 28B, 28C, 28D together surround or encircle the integrated circuit die 24 in this example. In other examples, fewer or more shim dies may be included in a layout proximate the integrated circuit die 24. The shim dies 28A, 28B, 28C, 28D can have any layout shape and with any dimensions. The shim dies 28A, 28B, 28C, 28D, as described above, can be dummy dies or dies that include an IPD without active circuitry.

A spacing D9 can be between each shim die 28A, 28B, 28C, 28D and the integrated circuit die 24. Encapsulant 40 can fill the regions between each shim die 28A, 28B, 28C, 28D and the integrated circuit die 24 corresponding to the spacing D9. The spacing D9 can be in a range from about 10 µm to about 250 µm. In some examples, the spacing D9 is about 70 µm.

In some examples where one or more of the shim dies 28A, 28B, 28C, 28D include an IPD, such as a de-coupling capacitor, the IPD may be placed in closer proximity to the integrated circuit die 24 compared to other solutions where a de-coupling capacitor may be attached to a package substrate outside of the CSP. If, for example, a de-coupling capacitor is attached to the package substrate outside of the CSP, the physical distance between the capacitor and the integrated circuit die may be about 4 mm. Comparatively, if a de-coupling capacitor is on a shim die (e.g., shim die 28A), the shim die may be, for example, about 70 µm from the integrated circuit die 24. The correspondingly shorter physical distance between the de-coupling capacitor and the integrated circuit die 24 may result in orders of magnitude smaller parasitic inductance that can be generated by the traces or lines connecting the de-coupling capacitor to the integrated circuit of the integrated circuit die 24.

A spacing D10 extends from an outer lateral edge of a shim die (shim die 28A in this example) to an outer lateral edge of the encapsulant 40, which defines an outer lateral edge of the CSP. The spacing D10, in some examples, can be up to about 0.4 mm.

A length D11 and a width D12 of shim die 28A is also illustrated in FIG. 3. Shim dies 28B, 28C, 28D each also have a length and a width. In some examples, the length and/or width can be in a range from about 1 mm to about 2 mm. The lengths and widths of the shim dies 28A-28D can be scalable to achieve a desired layout area of the CSP. By being able to scale the layout area of the CSP, pitches between bumps 62 may be scaled (e.g., increased) to facilitate designs. Examples are described below with respect to other figures to illustrate escape routing and increased pitches and fanout between bumps 62.

In some examples, with one or more shim dies 28 included in a CSP, materials of the various dies 24, 26, 28 can be the same or similar (such as implementing a silicon substrate for the dies 24, 26, 28). By implementing the same or similar material for the dies 24, 26, 28, the coefficient of thermal expansion (CTE) of the dies 24, 26, 28 can be matched. Hence, by including one or more shim dies 28 within the CSP, less encapsulant 40 (which may have a different CTE) may be included in the CSP compared to a CSP with the same components but no shim die. Hence, including one or more shim die 28 can reduce warpage of the CSP during thermal cycling, and the CSP can have enhanced mechanical warpage performance.

Figure 4:
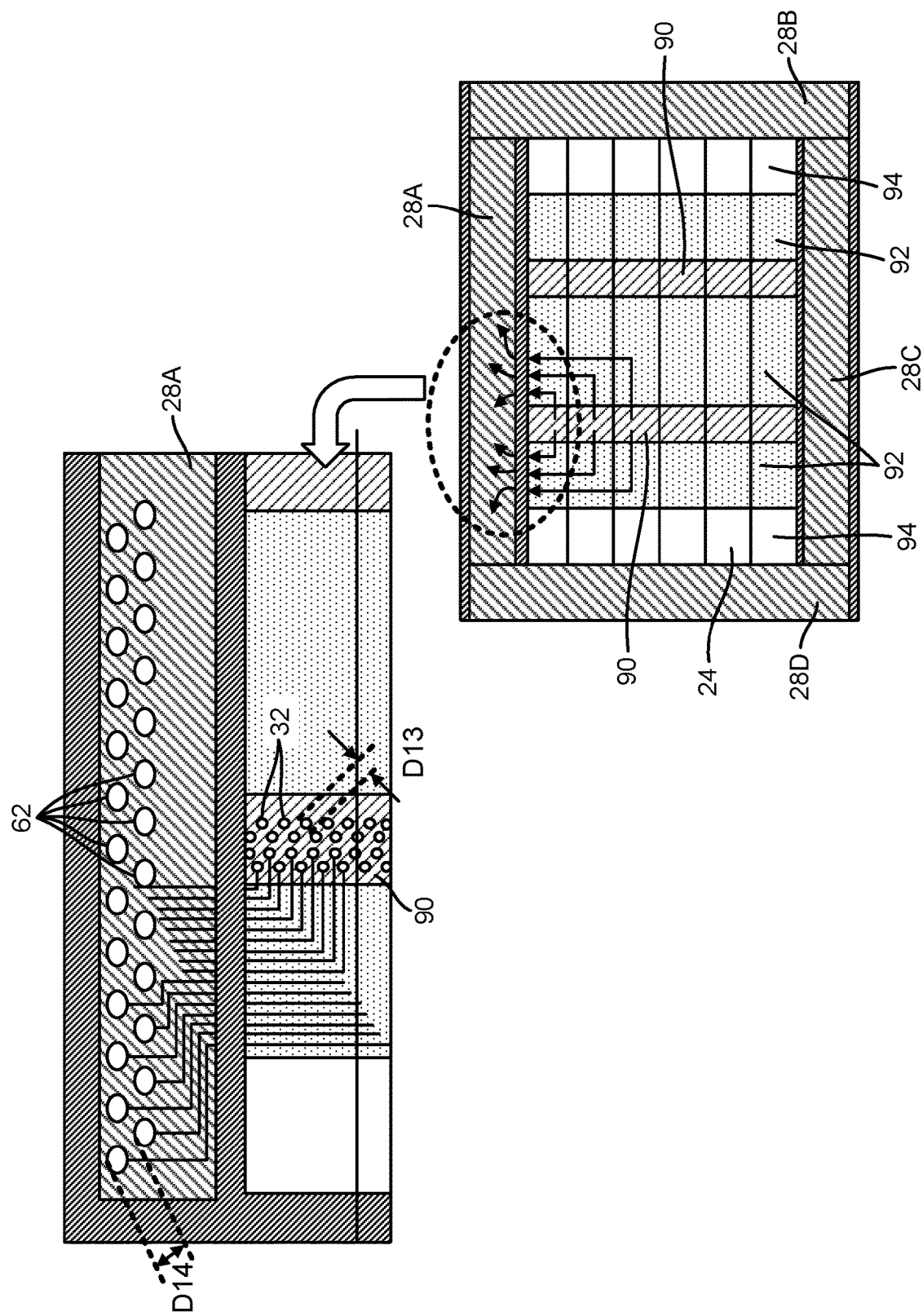
FIG. 4 illustrates the example layout of FIG. 3 in further detail, in accordance with examples of the present disclosure.

FIG. 4 illustrates further details of the example layout of the integrated circuit die 24 and shim dies 28A, 28B, 28C, 28D in a CSP, in accordance with examples of the present disclosure. The integrated circuit die 24 has columnar input/output (IO) banks 90 that have conductive pillars 32 for the IOs (e.g., IO connector components). The integrated circuit die 24 can have any number of columnar IO banks 90. FIG. 4 further shows an expanded view of a portion of the example layout. In the expanded view, conductive pillars 32 are shown in a portion of a columnar IO bank 90, and a pitch D13 is between nearest, neighboring conductive pillars 32.

Further in the expanded view, bumps 62 (and/or UBMs 60) are shown in an area that underlies a shim die 28A, and a pitch D14 is between nearest, neighboring bumps 62 (and/or UBMs 60). Some routing is shown between the conductive pillars 32 and the bumps 62 (and/or UBMs 60) to illustrate aspects of some examples. The routing includes various interconnected metal patterns 54 in the RDL 50 of the CSP. Although the bumps 62 (and/or UBMs 60) are illustrated underlying the shim die 28A, various bumps 62 (and/or UBMs 60) can underlie the integrated circuit die 24, any shim die 28A-28D, the encapsulant 40, or any other component of the CSP.

As apparent from FIG. 4, including one or more shim die 28 in the CSP can increase the area of the layout of the CSP, which can increase spacing for bumps 62 (and/or UBMs 60) relative to if a shim die 28 is not included. The increased area can therefore permit increased pitches D14 between bumps 62. For example, the pitches D14 can be greater than or equal to about 100 µm, such as in a range from about 100 µm to about 200 µm. Hence, the shim die 28 can provide additional area for fanout and for escape routing, which can reduce congestion and density of the bumps 62. The pitches D14 can permit fewer metal pattern layers in the RDL 50 and fewer layers in the package substrate 70 to be implemented, which can reduce cost of manufacturing.

FIG. 4 additionally illustrates logic regions 92 and serialization/deserialization (SerDes) regions 94 in the integrated circuit die 24. These regions 92, 94 define, in part, the area of the layout created by the integrated circuit die 24.

FIG. 5A illustrates an example layout of the integrated circuit die 24 and shim dies 28A, 28C in a CSP, in accordance with examples of the present disclosure. The integrated circuit die 24 of FIG. 5A does not include logic regions 92, or includes smaller logic regions 92 than the integrated circuit die 24 of FIG. 4. This can result in the area of the layout of the CSP defined by the integrated circuit die 24 in FIG. 5A to be smaller relative to that in FIG. 4. At least some of the logic regions 92 can be included in another integrated circuit die 96 stacked with the integrated circuit die 24 (e.g., in a three-dimensional (3D) architecture), as illustrated in the partial cross-sectional view of FIG. 5B. In some examples, the stacked integrated circuit dies 24, 96 of FIGS. 5A and 5B can be functionally equivalent to the integrated circuit die 24 of FIG. 4. However, in some examples, the area of the integrated circuit die 24 in the layout in FIG. 5A can be smaller than the area of the integrated circuit die 24 in the layout in FIG. 4. Hence, shim dies 28 can be included to reduce density and provide more area for escape routing and larger pitches of bumps 62 in FIG. 5A.

Figure 6:
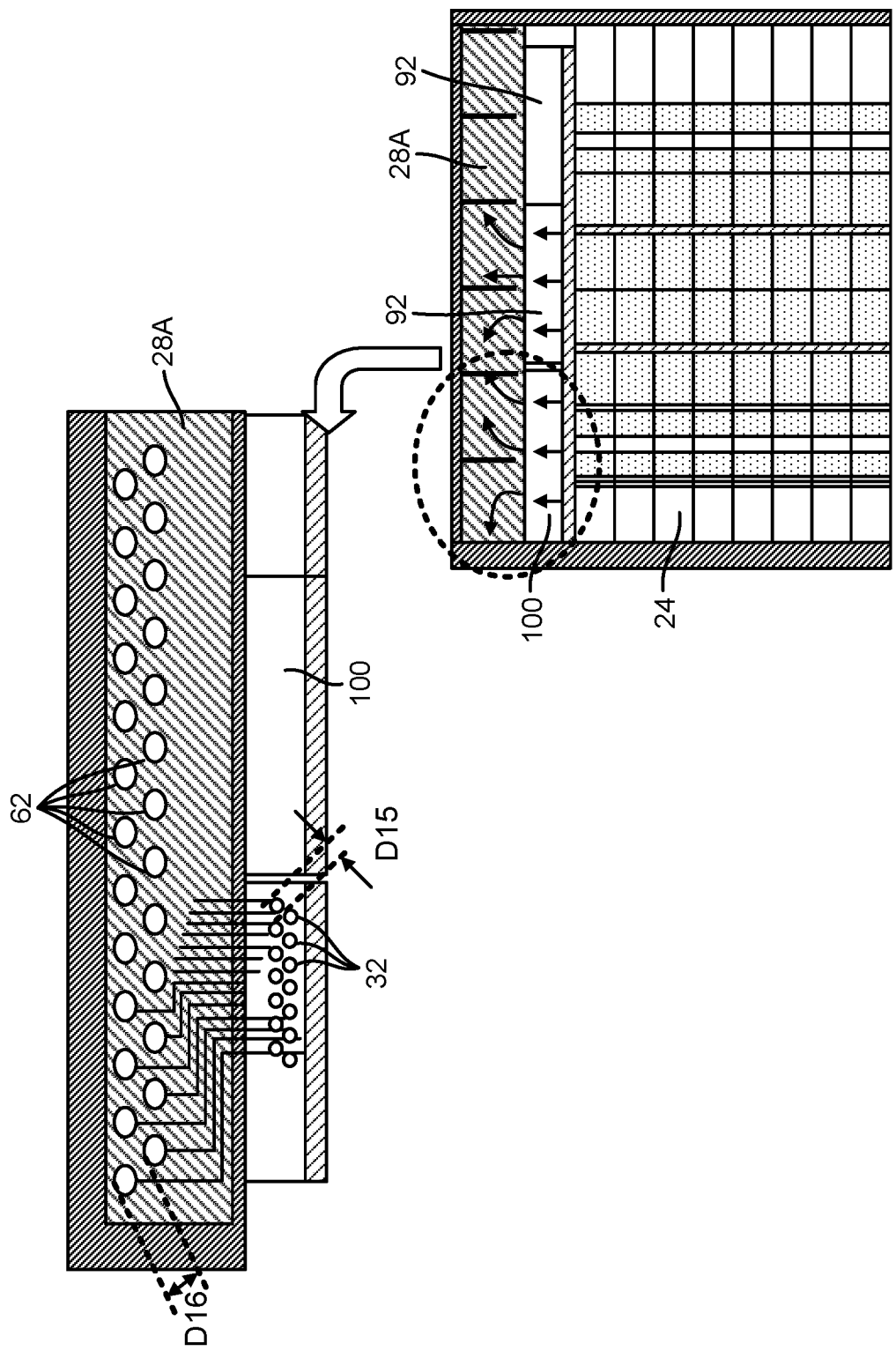
FIG. 6 is an example layout of an integrated circuit die and shim dies in a CSP, in accordance with examples of the present disclosure.

FIG. 6 illustrates an example layout of an integrated circuit die 24 and shim die 28A in a CSP, in accordance with examples of the present disclosure. The integrated circuit die 24 has peripheral IO banks 100 that have conductive pillars 32 for the IOs (e.g., IO connector components). The integrated circuit die 24 can have any number of peripheral IO banks 100. FIG. 6 further shows an expanded view of a portion of the example layout. In the expanded view, conductive pillars 32 are shown in a portion of a peripheral IO banks 100, and a pitch D15 is between nearest, neighboring conductive pillars 32. Further in the expanded view, bumps 62 (and/or UBMs 60) are shown in an area that underlies a shim die 28A, and a pitch D16 is between nearest, neighboring bumps 62 (and/or UBMs 60). Some routing is shown between the conductive pillars 32 and the bumps 62 (and/or UBMs 60) to illustrate aspects of some examples. The routing includes various interconnected metal patterns 54 in the RDL 50 of the CSP. Although the bumps 62 (and/or UBMs 60) are illustrated underlying the shim die 28A, various bumps 62 (and/or UBMs 60) can underlie the integrated circuit die 24, any shim die 28, the encapsulant 40, or any other component of the CSP.

As apparent from FIG. 6, including one or more shim die 28 in the CSP can increase the area of the layout of the CSP, which can increase spacing for bumps 62 (and/or UBMs 60) relative to if a shim die 28 is not included. The increased area can therefore permit increased pitches D16 between bumps 62. Hence, the shim die 28 can provide additional area for fanout and for escape routing, which can reduce congestion and density of the bumps 62.

Figure 7:
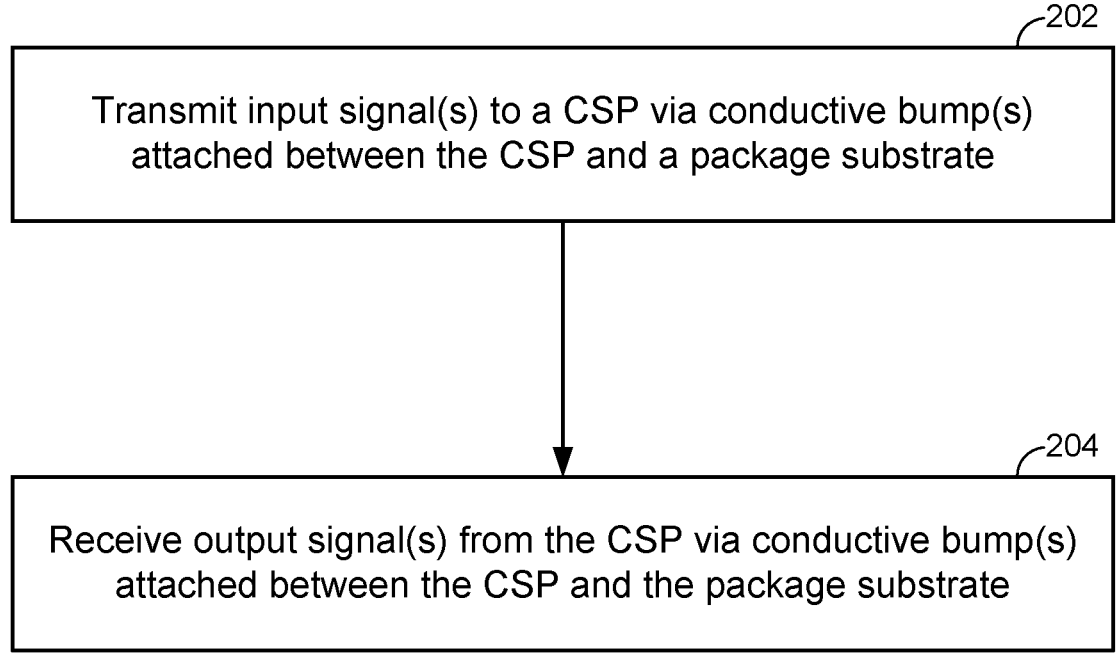
FIG. 7 is a flow chart of a general process for operating a CSP, in accordance with an example of the present disclosure.

FIG. 7 is a flow chart of a general process for operating a CSP, in accordance with an example of the present disclosure. In operation 202, one or more input signals are transmitted to a CSP via one or more conductive bumps attached between the CSP and a package substrate. For example, the CSP and package substrate can be the CSP and package substrate illustrated in and described with respect to FIGS. 1 and 2. The conductive bumps attached between the CSP and package substrate can be the bumps 62 illustrated in FIGS. 1 and 2. In operation 204, one or more output signals are received from the CSP via one or more conductive bumps attached between the CSP and the package substrate. The input and output signals may be signals operated upon and generated by an integrated circuit of an integrated circuit die (e.g., integrated circuit die 24) in the CSP. The CSP includes one or more shim dies (e.g., shim die 28), which can permit an increased pitch between the conductive bumps through with the input and output signals are conveyed. The CSP in the process for operating the CSP of FIG. 7 can have other aspects as described above with the foregoing figures.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A structure comprising:
    a first integrated circuit die;
    a shim die being a dummy die having no active or passive circuitry thereon;
    an encapsulant at least laterally encapsulating the first integrated circuit die and the shim die;
    a redistribution structure on the first integrated circuit die, the shim die, and the encapsulant, wherein the redistribution structure includes one or more metal layers electrically connected to the first integrated circuit die,
    conductive bumps attached to the redistribution structure, the conductive bumps including a plurality of input/output (IO) bumps aligned in a direction and contained within a dimension, the dimension being a sum of:
        (i) a dimension of the first integrated circuit die along the direction,
        (ii) a dimension of the shim die along the direction,
        (iii) a dimension of the encapsulant disposed along the direction and between a side opposite from the first integrated circuit die and another side opposite from the shim die.

2. The structure of claim 1 further comprising a heat sink attached to the first integrated circuit die and the shim die, the heat sink being opposite from the redistribution structure.

3. The structure of claim 1, wherein at least some of the IO bumps are on an area of the redistribution structure aligned with and parallel to an area of the shim die.

4. The structure of claim 3 further comprising a package substrate attached to the conductive bumps.

5. The structure of claim 1, wherein the first integrated circuit die includes input/output (IO) connector components on an active side of the first integrated circuit die, the IO connector components being in one or more columns, each of the one or more columns having, in a layout of the first integrated circuit die, a first region of the first integrated circuit die and a second region of the first integrated circuit die on opposing sides of the respective column.

6. The structure of claim 5, wherein the IO bumps are connected to the IO connector components through the one or more metal layers of the redistribution structure, wherein at least some of the IO are on an area of the redistribution structure aligned with and parallel to an area of the shim die.

7. The structure of claim 5 wherein:
the IO bumps are connected to the IO connector components through routing of the one or more metal layers of the redistribution structure;
at least some of the routing extends in the redistribution structure in a region defined by lateral boundaries of the shim die; and
a pitch of the IO bumps is greater than a pitch of the IO connector components.

8. The structure of claim 5, wherein the first region and the second region are respective logic regions of the first integrated circuit die.

9. The structure of claim 5 further comprising a second integrated circuit die stacked on a backside of the first integrated circuit die, the second integrated circuit die comprising logic integrated circuitry.

10. The structure of claim 1, wherein the first integrated circuit die includes input/output (IO) connector components on an active side of the first integrated circuit die, the IO connector components being along a periphery region of the first integrated circuit die.

11. The structure of claim 10, wherein the IO bumps are connected to the IO connector components through the one or more metal layers of the redistribution structure, wherein at least some of the IO bumps are on an area of the redistribution structure aligned with and parallel to an area of the shim die.

12. The structure of claim 10, wherein:
the IO bumps are connected to the IO connector components through routing of the one or more metal layers of the redistribution structure;
at least some of the routing extends in the redistribution structure in a region defined by lateral boundaries of the shim die; and
a pitch of the IO bumps is greater than a pitch of the IO connector components.

13. A structure, comprising:
a first integrated circuit die;
a shim die;
an encapsulant at least laterally encapsulating the first integrated circuit die and the shim die;
a redistribution structure on the first integrated circuit die, the shim die, and the encapsulant, wherein the redistribution structure includes one or more metal layers electrically connected to the first integrated circuit die;
a number of input/output (IO) bumps aligned in a direction is equal to a dimension divided by a linear pitch of the IO bumps along the direction; and
the dimension is a sum of:
(i) a dimension of the first integrated circuit die along the direction,
(ii) a dimension of the shim die along the direction,
(iii) a dimension of the encapsulant disposed along the direction and between the shim die and the first integrated circuit die,
(iv) a dimension of the encapsulant extending along the direction and from the shim die on a side opposite from the first integrated circuit die, and
(v) a dimension of the encapsulant extending along the direction and from the first integrated circuit die on a side opposite from the shim die.

14. A structure comprising:
a chip scale package (CSP) comprising:
an integrated circuit die;
a shim die being a dummy die having no active or passive circuitry thereon;
an encapsulant at least laterally encapsulating the integrated circuit die and the shim die;
a redistribution structure on the integrated circuit die, the shim die, and the encapsulant, the redistribution structure including one or more metal layers electrically connected to the integrated circuit die,
conductive bumps attached to the redistribution structure and electrically connected to the one or more metal layers, the conductive bumps including a plurality of input/output (IO) bumps aligned in a direction and contained within a dimension, the dimension being a sum of:
(i) a dimension of the integrated circuit die along the direction,
(ii) a dimension of the shim die along the direction,
(iii) a dimension of the encapsulant disposed along the direction and between a side opposite from the integrated circuit die and another side opposite from the shim die;
a package substrate attached to the conductive bumps.

15. The structure of claim 14 further comprising a heat sink attached to the CSP opposite from the conductive bumps.

16. The structure of claim 14, wherein the shim die includes an integrated passive device electrically connected to the one or more metal layers.

17. The structure of claim 14, wherein at least some of the conductive bumps are disposed in a region, the region being between the shim die and the package substrate in a direction perpendicular to a surface of the package substrate to which the conductive bumps are attached.

18. The structure of claim 14, wherein the CSP further comprises a stack of dies, the encapsulant further at least laterally encapsulating the stack of dies.

19. The structure of claim 13, wherein the shim die includes an integrated passive device electrically connected to the one or more metal layers.

20. The structure of claim 13, further comprising a heat sink attached to the first integrated circuit die and the shim die, the heat sink being opposite from the redistribution structure.

* * * * *